US010615574B2

(12) United States Patent
Ma et al.

(10) Patent No.: US 10,615,574 B2
(45) Date of Patent: Apr. 7, 2020

(54) SUPERLATTICE HETEROSTRUCTURES FORMED WITH SINGLE CRYSTALLINE SEMICONDUCTOR NANOMEMBRANES AND AMORPHOUS TUNNELING BARRIER LAYERS

(71) Applicant: Wisconsin Alumni Research Foundation, Madison, WI (US)

(72) Inventors: Zhenqiang Ma, Middleton, WI (US); Munho Kim, Champaign, IL (US); Jung-Hun Seo, East Amherst, NY (US); Sang June Cho, Fitchburg, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/982,252

(22) Filed: May 17, 2018

(65) Prior Publication Data

US 2019/0356114 A1    Nov. 21, 2019

(51) Int. Cl.
*H01S 5/34* (2006.01)
*H01S 5/22* (2006.01)

(52) U.S. Cl.
CPC .......... *H01S 5/2228* (2013.01); *H01S 5/2214* (2013.01); *H01S 5/3407* (2013.01)

(58) Field of Classification Search
CPC .... H01S 5/2214; H01S 5/3407; H01S 5/2228; H01S 5/34
USPC ...................................................... 372/43.01
See application file for complete search history.

(56) References Cited

U.S. PATENT DOCUMENTS

| 5,089,860 | A | * | 2/1992 | Deppe | ..................... H01L 33/06 257/13 |
| 5,238,868 | A | * | 8/1993 | Elman | ..................... B82Y 20/00 257/12 |
| 5,289,013 | A | * | 2/1994 | Goronkin | .............. H01L 29/122 257/14 |
| 5,296,721 | A | * | 3/1994 | Schulman | .............. B82Y 10/00 257/14 |
| 5,602,418 | A | * | 2/1997 | Imai | .................... H01L 31/1852 251/82 |
| 5,790,579 | A | * | 8/1998 | Lee | ........................ B82Y 20/00 372/45.01 |
| 7,002,175 | B1 |  | 2/2006 | Singh et al. | |

(Continued)

OTHER PUBLICATIONS

Shahjahan et al., Fabrication of Resonance Tunnel Diode by y-Al2O3/Si Multiple Heterostructures, Jpn. J. Appl. Phys. vol. 41, 2002, pp. 2602-2605.

(Continued)

*Primary Examiner* — Tuan N Nguyen
(74) *Attorney, Agent, or Firm* — Bell & Manning, LLC; Michelle Manning

(57) ABSTRACT

Superlattice structures composed of single-crystal semiconductor wells and amorphous barriers are provided. Also provided are methods for fabricating the superlattice structures and electronic, optoelectronic, and photonic devices that include the superlattice structures. The superlattice structures include alternating quantum barrier layers and quantum well layers, the quantum barrier layers comprising an amorphous inorganic material and the quantum well layers comprising a single-crystalline semiconductor.

22 Claims, 7 Drawing Sheets

(56) References Cited

U.S. PATENT DOCUMENTS

| | | | |
|---|---|---|---|
| 7,414,294 B2* | 8/2008 | Forrest | B82Y 10/00 257/40 |
| 8,866,154 B2 | 11/2014 | Ma et al. | |
| 8,895,406 B2 | 11/2014 | Rogers et al. | |
| 2005/0056827 A1 | 3/2005 | Li et al. | |
| 2014/0185640 A1* | 7/2014 | Jain | B82Y 20/00 372/45.011 |
| 2015/0280035 A1* | 10/2015 | Rihani | H01L 31/035236 257/21 |

OTHER PUBLICATIONS

Lee et al., Fabrication Process for Double Barrier Si-Based Quantum Well Resonant Tunneling Diodes (RTD) by UHV Wafer Bonding, . ECS Trans. 16(8), 2008, pp. 525-530.

Zang et al, Transfer-printed stacked nanomembrane lasers on silicon, Nature Photon. 6, 2012, pp. 615-620.

Ishikwa et al., Negative differential conductance due to resonant tunnelling through SiO2/single-crystalline-Si double barrier structure, IET Electron. Lett. 37, 2001, pp. 1200-1201.

Watanabe et al., Epitaxial Growth and Electrical Characteristics of CaF2/Si/CaF2 Resonant Tunneling Diode Structures Grown on Si(111) 1-off Substrate, Jpn. J. Appl. Phys. 39, 2000, pp. L964-L967.

Lake et al., Resonant Tunneling in Disordered Materials such as SiO2/Si/SiO2, IEEE International Symposium on Compound Semiconductors, San Diego, CA, Sep. 1997, pp. 617-620.

Lockwood et al., Quantum Confined Luminescence in Si/SiO2 Superlattices, Phys. Rev. Lett. 76, 1996, pp. 76.

Ikeda et al., Resonant tunneling characteristics in SiO2 ÖSi double-barrier structures in a wide range of applied voltage, Applied Physics Letters, vol. 83, No. 7, Aug. 18, 2003, pp. 1456-1458.

* cited by examiner

SUPERLATTICE HETEROSTRUCTURES FORMED WITH SINGLE CRYSTALLINE SEMICONDUCTOR NANOMEMBRANES AND AMORPHOUS TUNNELING BARRIER LAYERS

REFERENCE TO GOVERNMENT RIGHTS

This invention was made with government support under FA9550-09-01-0482 awarded by the USAF/AFOSR. The government has certain rights in the invention.

BACKGROUND

Quantum wells (QWs) consist of ultrathin semiconductor layers (i.e., semiconductor wells) sandwiched between barrier layers which have special properties due to the quantum confinement of charge carriers. These layers, in which both electrons and holes are confined, are typically very thin (10 nm or less) and of high quality to confine excitons (electrons and holes), as well as to avoid unwanted recombination sites. For these reasons, the formation of QWs has been realized by high-precision epitaxial growth techniques such as metal-organic chemical vapor deposition (MOCVD) or molecular beam epitaxy (MBE). Although such techniques have been widely and successfully used to realize many modem electronic devices, one significant restriction to the choice of material combination is that the lattice constants of the materials for the "walls" and "barriers" should be identical or at least very similar. If two materials have significantly different lattice constants, a continuous single crystal structure cannot be grown without introducing a large number of defects. Therefore, only a few sets of the material combinations are applicable to form QW structures such as Si/SiGe and AlGaAs/GaAs. From the aspect of practical applications, creating QWs on Si substrates implies direct integration of optoelectronics and photonics with Si Complementary Metal-Oxide-Semiconductor (CMOS). Furthermore, deep QWs with a large number of quantized energy levels allow room temperature (RT) operation of on-Si optoelectronic components. However, the QW structures epitaxially grown suffer from limited well depth, and thus a limited number of quantized energy levels due to a relatively small band offset (i.e., available barrier height).

Semiconductor-oxide structured QWs can offer a larger band offset (i.e., larger barrier height) than the aforementioned conventional (from epitaxy) QW structures. However, few such structures have been realized due to the difficulty in forming single crystalline films on top of amorphous oxide materials. Most of the semiconductor-oxide QWs rely on epitaxial growth techniques with special requirements with regard to crystal orientations, and single crystalline-amorphous oxide structures could not be made using these techniques. Wafer bonding has been used as an alternative method to create semiconductor-oxide QWs, but it could only demonstrate a single QW structure due to a process limitation. (See, e.g., Ishikawa, Y., et al., Negative differential conductance due to resonant tunnelling through Sift/single-crystalline-Si double barrier structure. *IET Electron. Lett.* 37, 1200-1201 (2001).) Moreover, a QW structure that was formed by the wafer bonding process does not provide the desired well/barrier sharpness of energy due to a slow atomic transition between a semiconductor and an oxide by a poor passivation associated with a native oxide. (See, e.g., Lee, T. H., et al., Fabrication Process for Double Barrier Si-Based Quantum Well Resonant Tunneling Diodes (RTD) by UHV Wafer Bonding. *ECS Trans.* 16(8), 525-530 (2008).)

SUMMARY

Superlattice structures composed of single-crystal semiconductor wells and amorphous barriers are provided. Also provided are methods for fabricating the superlattice structures and electronic, optoelectronic, and photonic devices that include the superlattice structures.

One embodiment of a superlattice includes alternating quantum barrier layers and quantum well layers. The quantum barrier layers are made of an amorphous inorganic material and the quantum well layers are thin layers of a single-crystalline Group III-V semiconductor, a single-crystalline Group II-V semiconductor, or a two-dimensional semiconductor.

One embodiment of a quantum cascade laser includes an active core embedded in an optical waveguide. The active core has a plurality of coupled laser stages, each stage comprising an electron injector, an active region coupled to the electron injector, and an electron extractor coupled to the active region. The active regions include a semiconductor superlattice comprising alternating quantum barrier layers and quantum well layers, the quantum barrier layers comprising an amorphous inorganic material and the quantum well layers comprising a single-crystalline semiconductor.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Superlattice structures composed of single-crystal semiconductor wells and amorphous barriers are provided. Also provided are methods for fabricating the superlattice structures and electronic, optoelectronic, and photonic devices that include the superlattice structures.

A superlattice is a periodic structure of thin layers of two different materials that have significantly different bandgaps, such that stacking the layers creates quantum wells in the lower bandgap material. The layers in a superlattice are thin enough to allow carrier transport and tunneling to take place.

The superlattice structures are made by transfer printing thin single-crystalline semiconductor NMs coupled with inorganic thin film deposition. Because the methods do not rely on epitaxially growth of the superlattice, the materials used in the alternating barrier layers and quantum well layers form non-epitaxial interfaces and can be selected independently. As a result, superlattice structures that could not be fabricated using conventional epitaxial growth can be formed. The quantum well layers can be composed of a variety of semiconductor materials, including Group IV semiconductors, Group III-V semiconductors, Group II-VI semiconductors, two-dimensional semiconductors, and combinations thereof. As used herein the term "epitaxial interface" refers to an interface in which the crystallographic orientation of an overlying layer is controlled by that of its underlying layer, such that the two layers have the same lattice constant (i.e., crystalline arrangement), at least in the area of the interface. An epitaxial interface may include strains and stresses at the interface, induced by a lattice mismatch between the two materials. In contrast to such epitaxial interfaces, non-epitaxial interfaces have crystallographic orientations that are independent from (e.g., different from) those of their neighboring layers and are free from lattice mismatch-induced strains and stresses.

The methods of forming the superlattice structures enable the fabrication of multiple quantum well (MQW) superlattice structures having many quantum wells. By way of illustration, the methods can be used to form MQW structures having at least three, at least 5, at least 10, at least 20, or at least 100 quantum wells.

The ability to independently select the materials of the quantum barriers and the quantum wells and to build structures with several quantum wells renders the methods well-suited for the fabrication of quantum cascade lasers (QCLs) having deep wells and high energy barriers. However, the superlattice structures can be incorporated into other MQW-based devices, such as resonant tunneling diodes, MQW-based lighting devices, MQW-based photovoltaic devices, and superlattice-based magnetic devices.

Figure 1A:
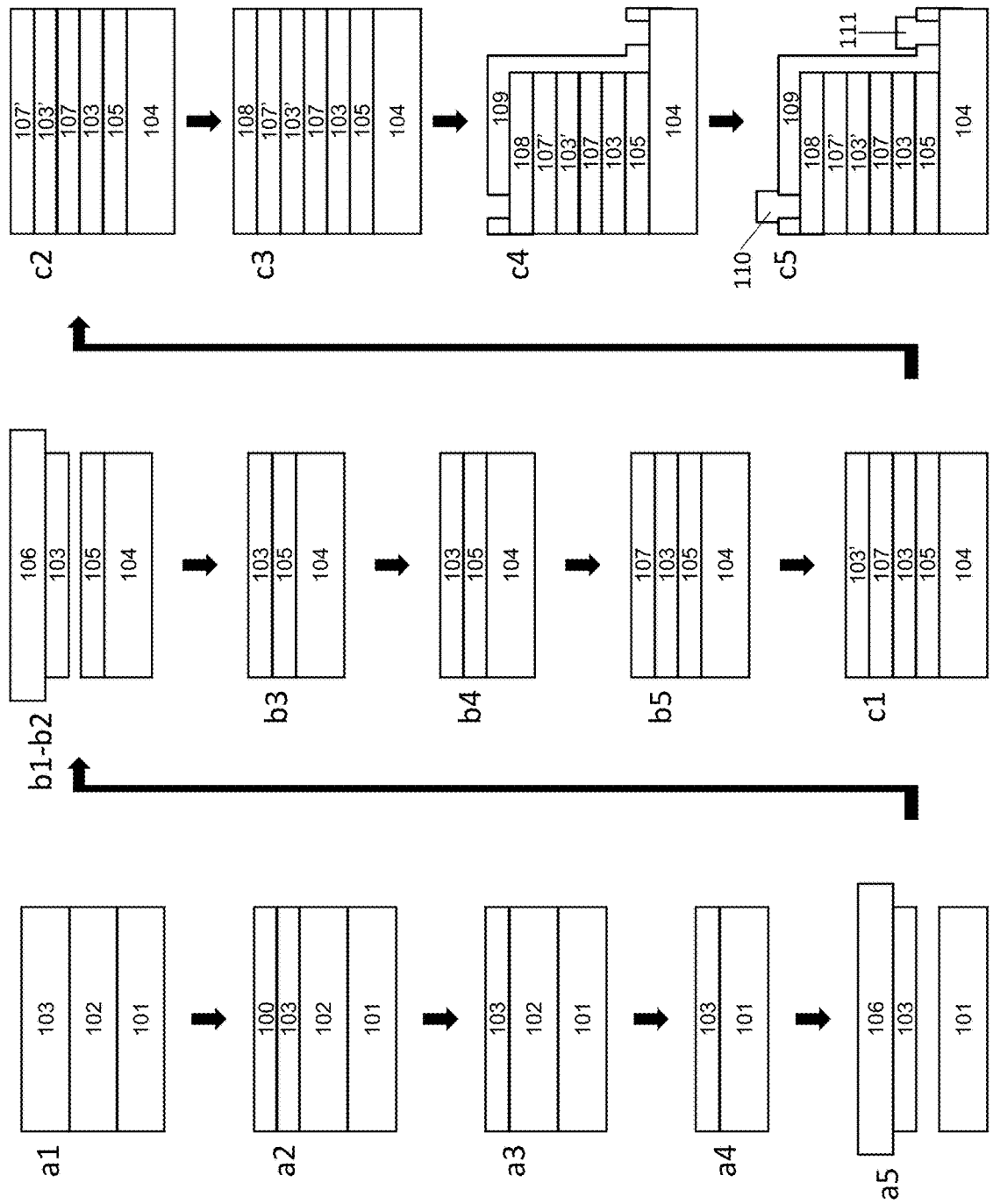
FIG. 1A. Panel a1: Cleaning an SOI wafer with the standard RCA cleaning processes. Panel a2: Dry oxidation to thin down the Si NM from 200 nm to 30 nm. Panel a3: Wet etching to remove the thermally grown oxide layer. Panel a4: Undercutting to remove the BOX layer to release the thin top Si layer (referred to as a nanomembrane, which may be abbreviated as Si NM). Panel a5: Picking up the released thinned Si NM via a PDMS stamp. Panels b1-b3: Transfer printing the Si NM onto an $Al_2O_3$ coated Si host substrate. Panel b4: An additional Si NM thinning step using dry etching, reducing the thickness from 30 nm to the 10 nm. Panel b5: Depositing a second ultra-thin $Al_2O_3$ tunneling barrier layer by ALD. Panel c1: Repeating the Si NM transfer and thinning down process. Panel c2: Depositing a third ultra-thin $Al_2O_3$ tunneling barrier layer by ALD. Panel c3: Transferring a partially heavy phosphorous doped Si NM for a top electrode layer. Panel c4: Depositing a 200 nm thick $SiO_2$ and via opening. Panel c5: Depositing Ti/Au (50/450 nm) metal contacts.

A schematic diagram illustrating a method of making a superlattice structure is shown in FIG. 1A. The fabrication can begin with a semiconductor-on-insulator wafer, such as a silicon-on-insulator (SOI) wafer, in which a buried oxide (BOX) layer 102 is sandwiched between a handle substrate 101 and a single-crystalline semiconductor device layer 103 (panel a1). Optionally, the silicon device layer can be thinned to an appropriate thickness for a quantum well layer in an MQW superlattice using, for example, a thermally grown oxide layer 100 (panel a1). BOX layer 102 is a sacrificial layer which is removed by selective etching to release single-crystalline semiconductor device layer 103 (panel a4). This can be carried out, for example, by forming an array of holes (apertures) through the device layer and then selectively chemically etching away the buried oxide layer that is exposed through the apertures. These apertures may be regularly spaced, or randomly spaced. As a result, the thin layer of single-crystalline semiconductor settles onto the underlying handle wafer (panel a4).

A substrate 104 upon which the superlattice will be fabricated is then prepared. The preparation may include cleaning the substrate and/or forming any materials and components that will be in physical, electrical, or optical communication with the superlattice structure in the completed device. For example, dielectric materials, electrical contacts, and/or materials that make up a waveguiding structure can be grown on, deposited over, or formed in the substrate. A first quantum barrier layer of an amorphous high bandgap inorganic material 105 is then deposited on the surface of substrate 104 to form a layer of a desired thickness (panels b1). By "high bandgap" it is meant that the material has a higher bandgap than the semiconductor of the quantum well layer. The inorganic material may be a material that is a dielectric material in its bulk form but is sufficiently thin that it allows for quantum tunneling to take place.

Released single-crystalline semiconductor device layer 103 is then transfer-printed onto the first quantum barrier layer 105 using an elastomeric stamp 106 to make the transfer (panels a5 and b1-b3). Optionally, the structure can be annealed after the transfer to enhance the bonding of the single-crystalline semiconductor layer. Next, another layer of amorphous inorganic material is deposited as a second quantum barrier layer 107 (panel b5). The transfer printing and inorganic layer deposition steps can be repeated multiple times to build up a superlattice structure having the desired number of quantum wells (103') and barriers (107') (panels c1 and c2).

Once the superlattice structure has been fabricated, additional materials and components in physical, electrical, or optical communication with the superlattice structure can be formed to complete the device. For example, dielectric materials, electrical contacts, and/or materials that make up a waveguiding structure can be grown on, deposited over, or formed in the superlattice structure. For example, a n-type contact layer 108, which may be a transferred single-crystalline semiconductor nanomembrane, can be formed on, or transferred onto the final barrier layer (panel c3), followed by the deposition of a layer of dielectric material 109 (panel c4). Vias can then be formed in layer 109 (panel c4) and metal contacts can be deposited (110, 111) (panel c5).

An alternative method of forming a single-crystalline semiconductor quantum well layer for transferring onto a quantum barrier layer uses wafer bonding followed by hydrogen implantation to create a splitting plane in the semiconductor material—a technique that is sometimes referred to as Smart Cut. A description of the Smart Cut process can be found in Bruel et al., *Proceedings 1995 IEEE International SOI Conference,* 178 (1995). In this technique, a buried hydrogen implantation layer is formed in a single-crystal semiconductor substrate, such as a silicon wafer. The depth of hydrogen implantation layer will determine the thickness of the single-crystalline semiconductor layer to be transferred. Once the splitting plane is formed via hydrogen implantation, the surface of substrate is contacted with the pre-formed inorganic quantum barrier layer (105). The substrate is then split at the hydrogen implantation layer and the bulk of the substrate is removed. The transferred single-crystalline semiconductor thin film can optionally be thinned prior to or subsequent to transfer. For example, a Smart Cut process for releasing a SiC NM from a SiC substrate can be found in M. Kim et al., Journal of Materials Chemistry C, 5 (2) 264 (2017).

Examples of inorganic materials that can be used as quantum barriers in a superlattice include oxides, nitrides, and oxynitrides. Illustrative examples of oxides include aluminum oxide ($Al_2O_3$), titanium oxide ($TiO_2$), hafnium oxide ($HfO_2$), tantalum oxide ($Ta_2O_5$), and silicon dioxide ($SiO_2$). In some embodiments, the metal, semiconductor or metalloid elements present in the oxide, nitride, or oxynitride are different from any metal, semiconductor or metalloid elements in the quantum well semiconductor layers with which they are in contact. The inorganic oxides can be deposited using, for example, atomic layer deposition (ALD).

Examples of semiconductor materials that can be used as the quantum wells and coupled with the above-referenced inorganic materials in a superlattice include Group IV semiconductors, such as silicon (Si), germanium (Ge), and silicon-germanium (SiGe).

Examples of Group III-V semiconductors that can be used as the quantum wells and coupled with the above-referenced inorganic materials in a superlattice include GaAs, InP, AlGaAs, and InGaAs. In some embodiments, the Group III-V semiconductors are Group III-Nitrides, such as GaN, AlN, InN, AlGaN, InGaN, InAlN, and GaAsN.

Examples of Group II-VI semiconductor materials that can be used as the quantum wells and coupled with the above-referenced inorganic materials in a superlattice include Group II-VI materials, such as SiC.

Examples of 2D semiconductor materials that can be used as the quantum wells and coupled with the above-referenced inorganic materials in a superlattice include graphene, $MoS_2$, $MoSe_2$, $MoTe_2$, phosphorene, silicene, $WS_2$, $WSe_2$, $GaSe_2$, $ZrS_3$, $HfS_3$, ZnO and h-BN. These 2D semiconductors can be exfoliated using, for example, a PDMS stamp and then transfer printed onto a desired substrate.

The etch chemistry used for the release of a given semiconductor device layer will depend on the sacrificial layer from which it is being released. However, semiconductor selective etchants are known for a variety of semiconductor materials. For example, layers of Si, Ge, or SiGe can be released from a buried $SiO_2$ or $GeO_2$ layer using a hydrofluoric acid (HF) etch; layers of GaAs, InP, and AlGaAs can be released from a buried AlGaAs sacrificial layer using HF. (In the case of an AlGaAs device layer, the AlGaAs sacrificial layer would have a higher aluminum content.) A GaAs device layer can be released from a sacrificial GaAsN layer using aqueous NaOH, and a InGaAsP device layer can be released from a sacrificial InGaAs layer using an $HF:H_2O_2:H_2O$ etch. AlGaAs with a high aluminum content can be released from GaAs using a citric acid:$H_2O_2$:$H_2O$ etch. Also, Group III-nitrides can be released using: (1) $XeF_2$ wet etching, if the III-nitride is grown on a sapphire substrate (T.-H. Chang et al, Microwave Symposium 2015 "High power fast flexible electronics: Transparent RF AlGaN/GaN HEMTs on plastic substrates", or electrochemical etching if a heavily doped GaN layer is used as a sacrificial layer (T.-H. Chang et al, Scientific Reports 7 6360 (2017)); and (2) Laser lift-off to release a GaN NM from a bulk substrate (J.-H. Seo et al, IEEE Photonics Journal, 7 (2) 8200207 (2015).). However, other known selective etch chemistries and release and transfer mechanisms can be used.

The thicknesses of the inorganic oxide quantum barrier layers can be determined by the deposition times. The thicknesses of the semiconductor quantum wells layers can be tailored using thinning steps during the transfer printing steps, and by the depth of the implantation layer if Smart Cut is used. The optimal thicknesses of the layers will depend on the performance requirements of the device into which the superlattice will be incorporated. For example, the absorption and/or emission wavelengths of an optoelectronic device can be controlled by adjusting the layer thicknesses in the superlattice. For many device applications, the layer thicknesses of the quantum barrier layers and the quantum well layers will be in the range from about 2 nm to about 100 nm, including in the range from about 2 nm to about 50 nm, and further including in the range from about 3 nm to about 20 nm.

Figure 5:
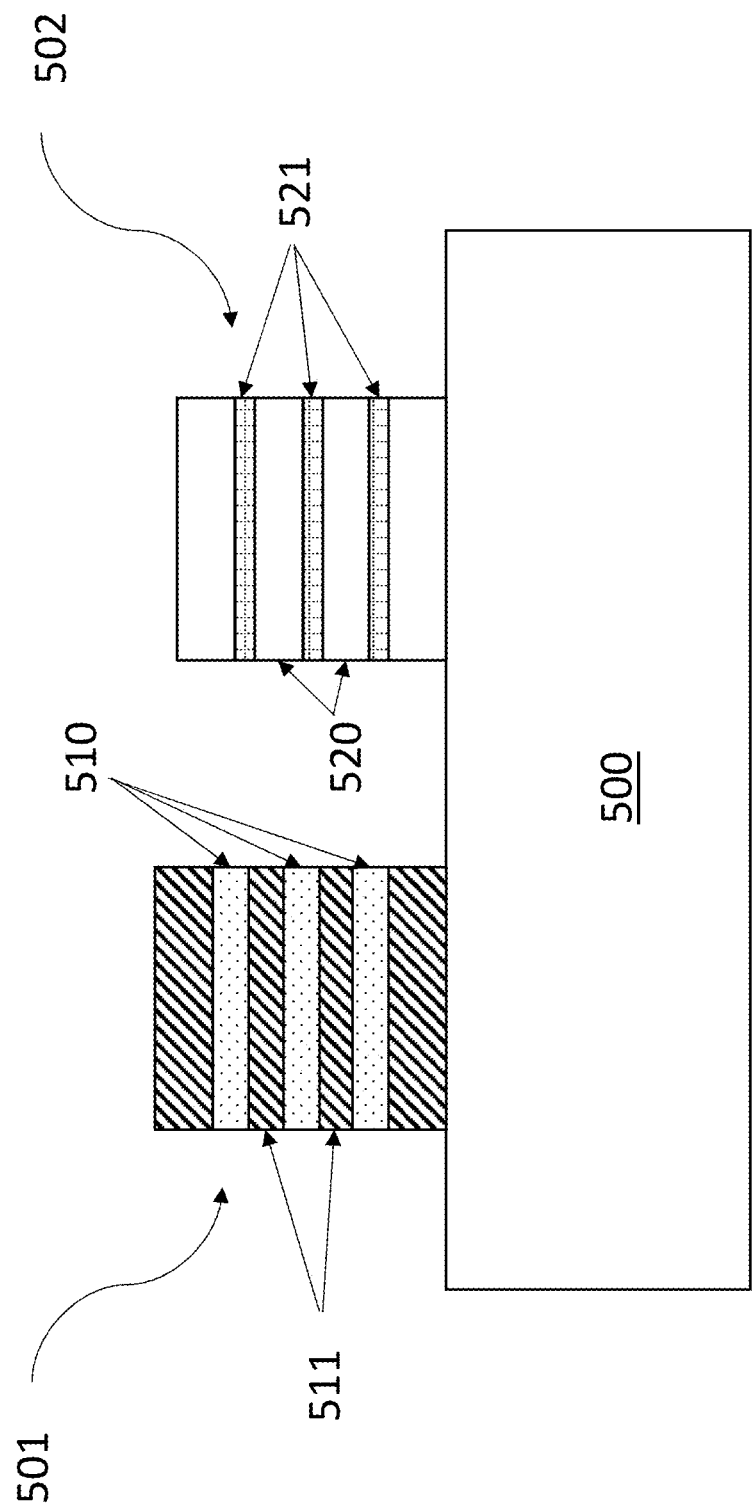
FIG. 5 is a schematic diagram of two different superlattice structures on the same support substrate.

Because the superlattice structures do rely upon the epitaxial growth on the MQW structure, they can be fabricated on a broad variety of substrates, including semiconductor substrates (e.g., silicon wafers), metal substrates, dielectric substrates, and polymer substrates—including semiconducting polymer substrates and electrically conducting polymer substrates. Moreover, arrays of multiple superlattice structures on the same substrate can be made from different materials and can have different dimensions, different MQW layer thicknesses, and/or different numbers of quantum barrier layer/quantum well layer pairs. This is illustrated schematically in FIG. 5, which shows a first superlattice structure 501 and a second superlattice structure 502 on the surface of a support substrate 500. First superlattice structure 501 includes quantum barrier layers made of a first amorphous inorganic material 510 and quantum well layers made of a first single-crystalline semiconductor material 511. Second superlattice structure 502 includes quantum barrier layers made of a second amorphous inorganic material 520 and quantum well layers made of a second single-crystalline semiconductor material 521. Although only two superlattice structures are depicted in FIG. 5, arrays can include many more. For example, an array could include at least 10, at least 100, at least 1000, or even more superlattice structures.

Figure 4B:
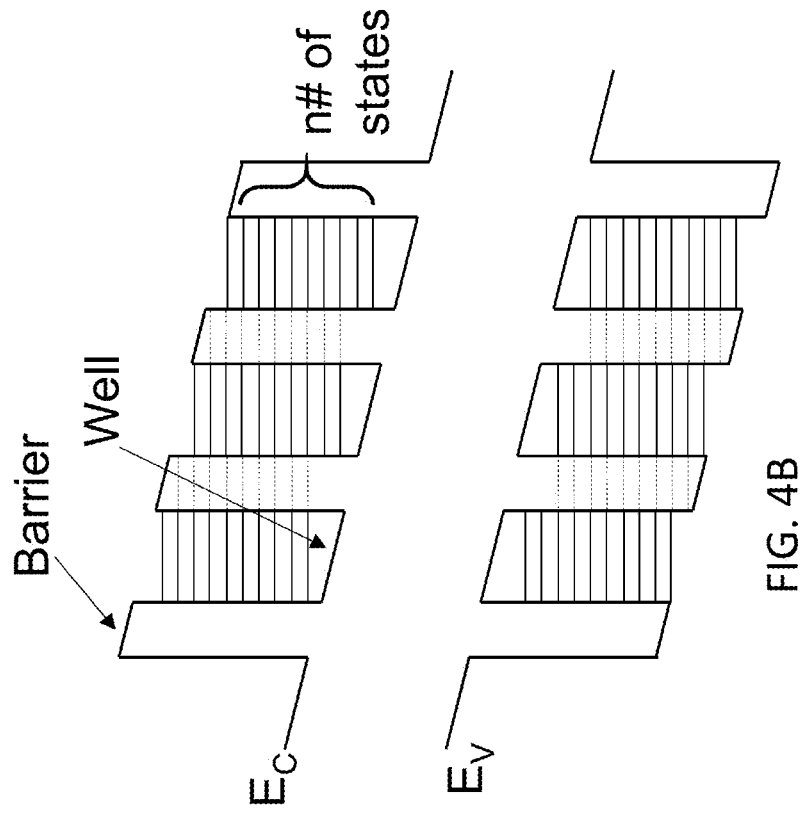
FIG. 4B shows the band diagram, including both the valance and conduction bands, for an active region of a QCL that comprises a superlattice structure having four amorphous inorganic barrier layers and three single-crystalline semiconductor quantum wells.
Figure 4A:
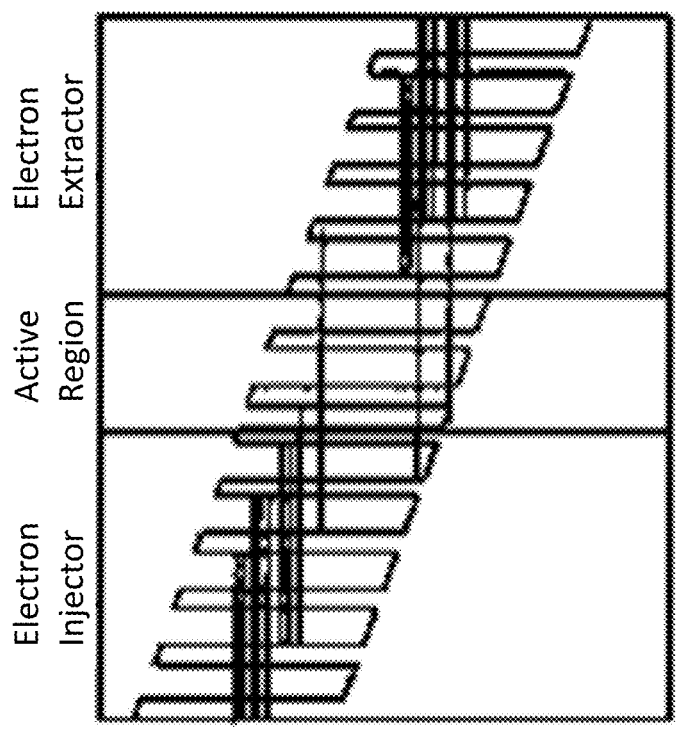
FIG. 4A shows the conduction band energy diagram for one stage of a quantum cascade laser structure, including an electron injector, and active region, and an electron extractor.

The superlattice structures can be incorporated into a quantum cascade laser (QCL). A quantum cascade laser has an active core embedded in an optical waveguide. The active core is composed of a plurality of coupled laser stages, each stage having an electron injector, an active region coupled to the electron injector, and an electron extractor coupled to the active region, where the electron extractor can serve as the electron injector for the active region of the next stage. In each quantum well of the active region, light is generated by intersubband transitions in the conduction band of a MQW structure. By applying an electrical voltage across the MQW structure, a cascade of quantum wells of different depths develops. Radiative electron transition between the subbands of the quantum wells give rise to lasing. FIG. 4A shows the conduction band energy diagram for one stage of a quantum cascade laser structure, including an electron injector, and active region, and an electron extractor. FIG. 4B shows the band diagram, including both the valance and conduction bands, for an active region of a QCL that comprises a superlattice structure having four amorphous inorganic barrier layers and three single-crystalline semiconductor quantum wells. During operation electrons are injected into a higher energy level (E3) in the active region. These electrons then undergo an intersubband radiative transition to a lower energy level (E2). The wavelength of the emitted photon is determined by the energetic spacing between these two levels. A fast transition to a still lower energy level (E1) extracts the electron from level E2 and the electron is then extracted into the extractor. In addition to using the present methods to fabricate the superlattice of the active region of the QCL, the methods including a transfer printing step can also be used to fabricate the quantum well and barrier layers of the electron injector and/or the electron extractor.

In the active region, the energy difference between the subbands can be controlled by adjusting the thicknesses of the inorganic quantum barrier layers and the single-crystalline semiconductor quantum well layers of the superlattice. As such, the layer thicknesses in the superlattice structure can be tailored to achieve lasing in a desired region of the electromagnetic spectrum, including in the infrared (e.g., mid-infrared).

Figure 6:
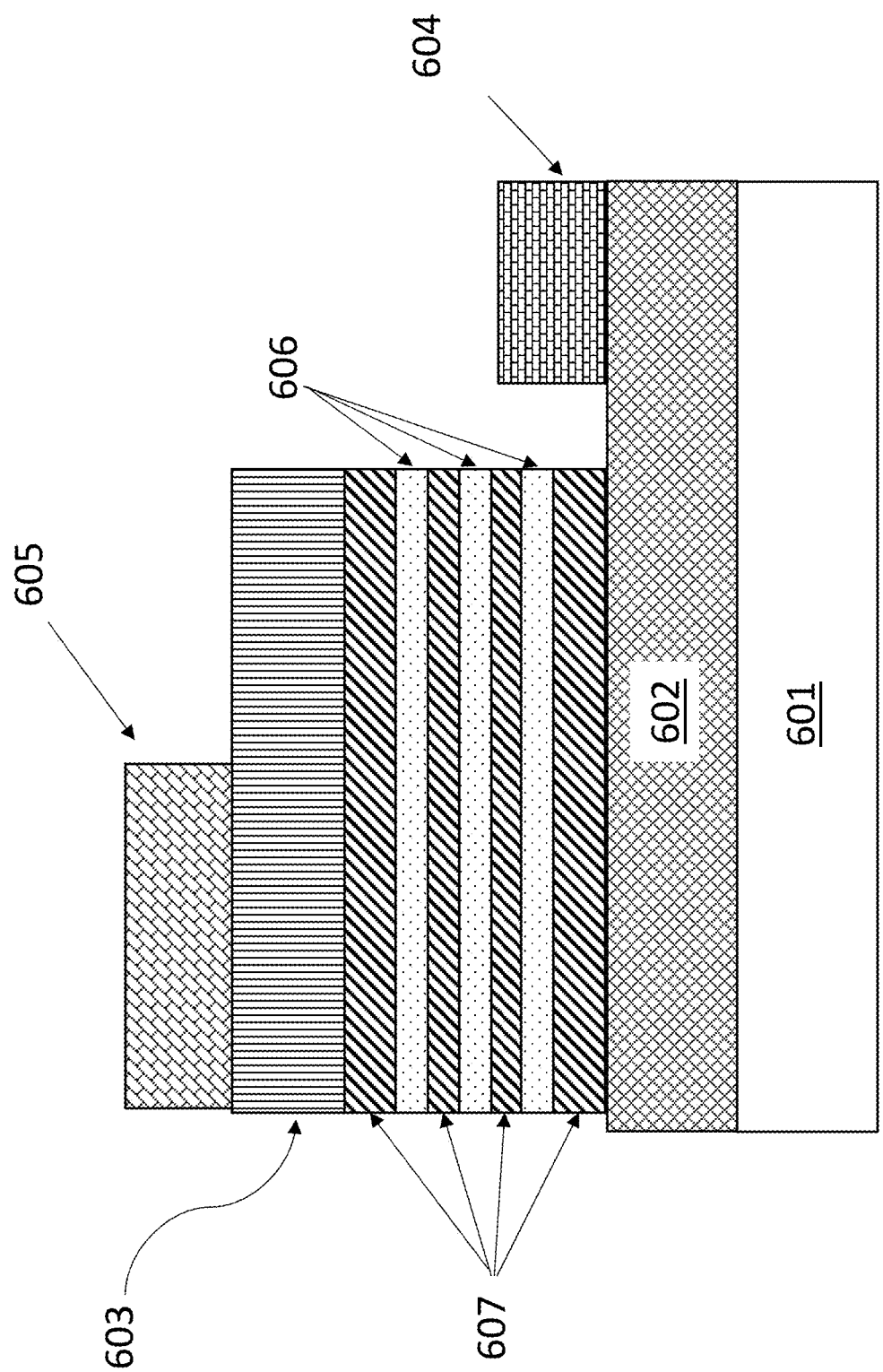
FIG. 6 is a schematic diagram of a MQW-based structure for LED, photovoltaic, or magnetic device applications.

Other devices into which the superlattice structures can be incorporated include a resonant tunneling diode that includes a superlattice comprising a single single-crystalline semiconductor quantum well layer disposed between a pair of amorphous inorganic quantum barrier layers. The resonant tunneling devices further include an emitter and a collector in electrical communication with the superlattice structure and will commonly also include a collector spacer layer between the collector and the superlattice structures, as well as an emitter spacer between the emitter and the superlattice structure. The superlattice structures can also be incorporated into MQW-based lighting devices, MQW-based photovoltaic devices, and superlattice-based magnetic devices. By way of illustration, an embodiment of a MQW-based structure for LED, photovoltaic, or magnetic device applications is illustrated schematically in FIG. 6. The structure includes a device substrate 601, an overlying n-type contact layer 602 composed of a heavily n-type doped semiconductor, a p-type contact layer 603 composed of a heavily p-type doped semiconductor, an ohmic n-type contact 604 in electrical communication with n-type contact layer 602, and an ohmic p-type contact 605 in electrical communication with p-type contact layer 603. A superlattice of the type described herein comprises a plurality of quantum well layers 606 between pairs of barrier layers 607 is sandwiched between contact layers 602 and 603.

Example

This example illustrates the demonstration of multiple barrier heterostructures (MBHs) formed by stacking transferable Si nanomembranes (Si NMs) as well layers and depositing amorphous aluminum oxide ($Al_2O_3$) as barrier layers. Si NMs not only inherit the single crystalline quality and the electronic properties of a bulk Si wafer, but also enable the formation of a multi-QW superlattice structure by multiple transfer steps, which is not possible by other alternative bonding methods. The $Al_2O_3$ layer coated by an atomic layer deposition (ALD) system is one of the best materials to passivate the Si surface, thus reducing the unwanted recombination sites effectively and enabling a sharp potential well. As a proof-of-concept demonstration using this approach, a superlattice having double QWs (triple barrier: TB) was fabricated on an Si substrate, and quantum tunneling effects were observed at RT.

FIG. 1A schematically illustrates the representative processing steps for fabricating the $Al_2O_3/Si/Al_2O_3$ TB heterostructures. The fabrication began with cleaning a commercially available (from Soitec) silicon-on-insulator (SOI) wafer having a 200 nm thick Si template layer and a 145 nm thick buried oxide (BOX) layer. The 200 nm thick top single crystalline Si device layer was thinned down to 10 nm by a combination of thermal oxidation and dry etching. Firstly, a 300 nm thick $SiO_2$ was grown by dry oxidation at 1050° C. for 8 hours and 30 minutes to consume 150 nm of the top Si layer as the first step of the thinning process, followed by wet etching with concentrated hydrofluoric acid (HF, 49%). After the completion of $SiO_2$ removal, a 50 nm thick single crystalline Si top layer remained. A 30 nm thick single crystalline Si layer was achieved by a second oxidation step (using a 44 nm thick $SiO_2$ layer). The thickness of the top Si layer was carefully measured by an Optical Reflectometer (Filmetric F-20) at each step. An array of 120×120 $\mu m^2$ Si squares was patterned on the thinned device layer of the SOI by photolithography and reactive ion etch (RIE, Unaxis 790) using $SF_6$ and $O_2$ gases to expose the underlying BOX layer. The 145 nm thick BOX layer of the thinned device layer of the SOI was undercut with HF solution. The released top single crystalline Si layer, now referred to as an Si NM, was then ready for transfer-printing onto a host substrate.

Figure 1B:
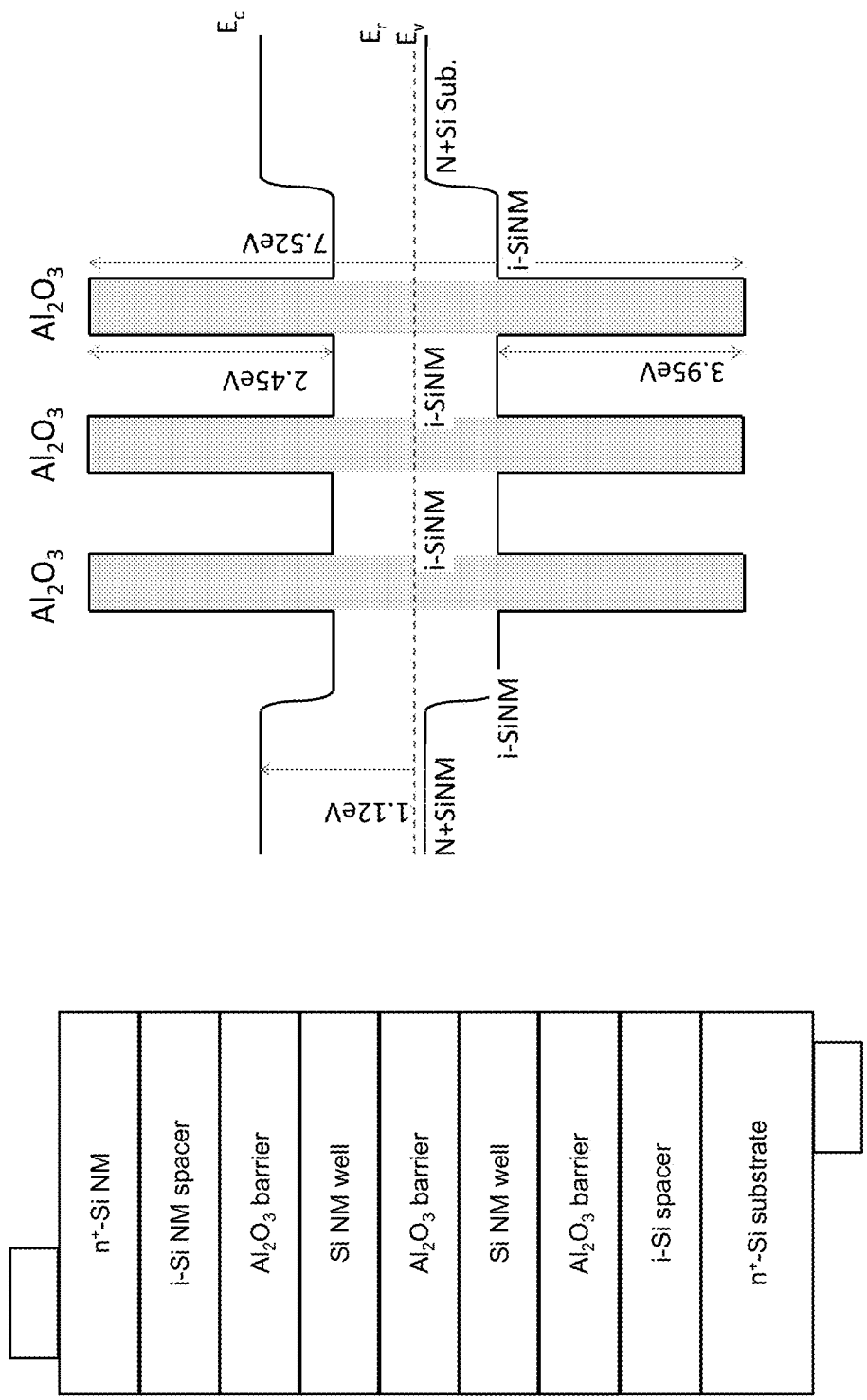
FIG. 1B is a schematic diagram of the layer structure (left) and band diagram (right) of a triple-barrier superlattice device.

A new host Si substrate (n-type, $1\times10^{20}$ $cm^{-3}$) was prepared with a standard cleaning process. Then, a 30 nm thick intrinsic (i) Si layer was grown by Si molecular beam epitaxy at ultra-high vacuum (UHV) on top of the Si host substrate to reduce impurity scattering of travelling electrons during device operation. A 3 nm aluminum oxide ($Al_2O_3$) tunneling layer was precisely coated on the above-mentioned host substrate as a first QW barrier layer by atomic layer deposition (ALD). An $Al_2O_3$ tunneling layer has a conduction band offset of 2.45 eV with respect to Si, as shown in the band diagram of FIG. 1B.

The released Si NM was transfer-printed onto the $Al_2O_3$-coated Si substrate using an elastomeric polydimethylsiloxane (PDMS) stamp. A relatively thick PDMS stamp (~1 cm) was used to prevent the very thin Si NMs from fracturing during the transfer process. The Si substrate with the transferred Si NM was annealed using a rapid thermal anneal (RTA) at 300° C. for 5 minutes in a nitrogen ambient to enhance the bonding strength between the Si NMs and the Si substrate. In order to achieve a final thickness of 10 nm while maintaining a smooth surface, additional dry etching with $CF_4$ and $O_2$ gases on the transferred Si NM layer was performed. After that, another $Al_2O_3$ tunneling layer was deposited for a second QW barrier. The final 340 nm thick Si NMs with a heavily phosphorous doped (~$1\times10^{20}$ $cm^{-3}$, 310 nm) and a lightly phosphorous doped (~$5\times10^{14}$ $cm^3$, 30 nm) region were transfer printed on top of the second tunneling layer. For the triple barrier (TB) structure, the transfer printing, $Al_2O_3$ tunneling layer deposition, and annealing steps were repeated to form an additional pair of Si NM/$Al_2O_3$ QWs. These steps can be repeated to build up a superlattice having a greater number of quantum barriers and wells. Active mesa areas were defined by photoresist and RIE, followed by 1:100 diluted HF. Then, the device was passivated with a 200 nm thick $SiO_2$ layer by plasma-enhanced chemical vapor deposition (PECVD). Via holes were opened by dry and wet etching, followed by the deposition of a Ti/Au stack (50/450 nm) by e-beam evaporation to form the anode and cathode.

An atomically smooth interface is critical to realizing the quantum confinement between barriers, and thus to obtaining a superlattice for a QCL. Therefore, careful control of surface roughness during the Si NM thinning process was required. Typical AFM images of the Si NMs before and after the thinning process indicated that no fractures or cracks on the Si NMs were found during the thinning and transfer-printing processes. The thickness of the Si NM after the first thinning (from 200 nm to 30 nm) and transfer steps was measured to be 33.12 nm, with the root mean square (RMS) roughness ($R_q$) of 1.425 nm. The thickness and $R_q$ of the final Si NM were measured to be 12.52 nm and 0.861 nm, respectively. The improvement of the surface roughness of $R_q$ from 1.425 to 0.861 nm by the second thinning step (i.e., the RIE etching step) can be explained by the volatile etching of by-products, particularly when there was a pre-existing rough surface.

To experimentally determine the valence and conduction band discontinuities at the $Al_2O_3$/Si NM heterojunctions, X-ray photoelectron spectroscopy (XPS) analysis was carried out. The measurement was performed on the identical structure with the same thickness (i.e., 3 nm $Al_2O_3$/10 nm Si NM) using a micro-focused monochromatic Al Ka X-ray source. XPS spectrum collected from the 3 nm $Al_2O_3$/10 nm Si NM superlattice structure showed peak centroids of Si2p and Al2p measured to be 99.08 eV and 74.78 eV, respectively. The energy difference between the valence band edge and the Al2p centroid of the $Al_2O_3$ was evaluated from the sample with a thicker $Al_2O_3$ (10 nm $Al_2O_3$/Si). The valence band edge of the $Al_2O_3$ was extracted to be 4.55 eV using a regression-determined line segment. (See, e.g., Chambers, S. A., et al., Band discontinuities at epitaxial heterojunctions. *Appl. Phys. Lett.* 77, 1662 (2000).) The energy difference between the valence band edge and the Al2p centroid was calculated to be 70.73 eV using the measured peak centroid of the Al2p (i.e., 75.28 eV). Based on the above measurements, the valence and conduction band offset can be determined using the following equations:

$$\Delta E_V = (E_{Si2p} - E_{Al2p})_{Si/Al_2O_3} - (E_{Si2p} - E_V)_{Si} + (E_{Al2p} - E_V)_{Al_2O_3} \quad (1)$$

$$\Delta E_C = \Delta E_V - (\Delta E_g)_{SiNM-Al_2O_3} \quad (2)$$

where Ev is the valence band edge, and $(\Delta E_g)_{Si\ NM-Al2O3}$ is the band gap difference between the Si NM and the $Al_2O_3$. (See, e.g., Kornblum, L., et al., Transport at the Epitaxial Interface between Germanium and Functional Oxides. *Adv. Mater. Interfaces* 2, 1500193 (2015).) The valence band offset was determined to be −3.95 eV. To evaluate the conduction band offset, the band gap of the $Al_2O_3$ (i.e., 7.52 eV) was carefully measured using energy loss spectra of O1s for the $Al_2O_3$. (See, e.g., Miyazaki, S. Characterization of high-k gate dielectric/silicon interfaces. *Appl. Surf. Sci.* 190, 66-74 (2002).) Using the valence band offset and band gap of the Si and $Al_2O_3$ in Eq. (2), the conduction band offset was finally determined to be 2.45 eV. The measured $Al_2O_3$/Si NM conduction band offset was larger than those reported from other material systems such as AlN/GaN (i.e., 2.1 eV), AlGaAs/GaAs (i.e., 0.4 eV), and Si/SiGe (i.e., 0.17 eV) which resulted in a large peak-to-valley current ratio (PVCR) and multiple negative differential resistance (NDR) points from the $Al_2O_3$/Si NM based superlattice structures. (See, e.g., Bayram, C., et al., AlN/GaN double-barrier resonant tunneling diodes grown by metal-organic chemical vapor deposition. *Appl. Phys. Lett.*, 96, 042103 (2010); Nakagawa, T., et al., Observation of resonant tunneling in AlGaAs/GaAs triple barrier diodes. *Appl. Phys. Lett.* 49, 73 (1986); and Liu, H. C., et al., Resonant tunneling in Si/Si$_{1-x}$Ge$_x$ double-barrier structures. *Appl. Phys. Lett.* 52, 1809 (1988).)

The possible existence of strain on the transferred Si NM that may be induced during the high temperature processes used for the thinning of the Si NM was examined. The possible effects of NM bonding to the material properties of the Si NM and the quality of the MBH were also considered. To trace the strain condition during the thinning down and stacking processes, Raman spectroscopy was carefully performed on the Si NM after each thinning step. A 50× objective lens was used to focus a green laser (532 nm) onto the sample surface. An Si substrate was used as a reference, and this confirmed a strong Si—Si characteristic peak at 520.2 cm$^{-1}$. A 200 nm thick Si NM, taken after the transfer on the quartz substrate, also showed a strong peak at 520.2 cm$^{-1}$. A 10 nm thick Si NM, which was transferred and thinned down on the quartz substrate, still showed a clear Si characteristic peak at 520.2 cm$^{-1}$ with a slightly weaker intensity. This indicates that a strain-free thin Si NM was achieved using the thinning process. To evaluate the strain condition of the stacked layers used in the device, the TB structure was prepared on the quartz substrate. The sample was annealed under the same conditions (i.e., 300° C. for 5 minutes) used in the device fabrication to mimic the thermal budget. A strong Si—Si characteristic peak was measured at 520.2 cm$^{-1}$. As a result, ultra-smooth, thin Si NM was formed with no built-in strain. No strain was induced from the thinning/stacking of Si NMs or the annealing step for the Si NM bonding. Therefore, the stacking of multiple layers of Si NM and $Al_2O_3$ by NM transfer can easily realize a large conduction band offset without complicated and delicate strain engineering.

Figure 2:
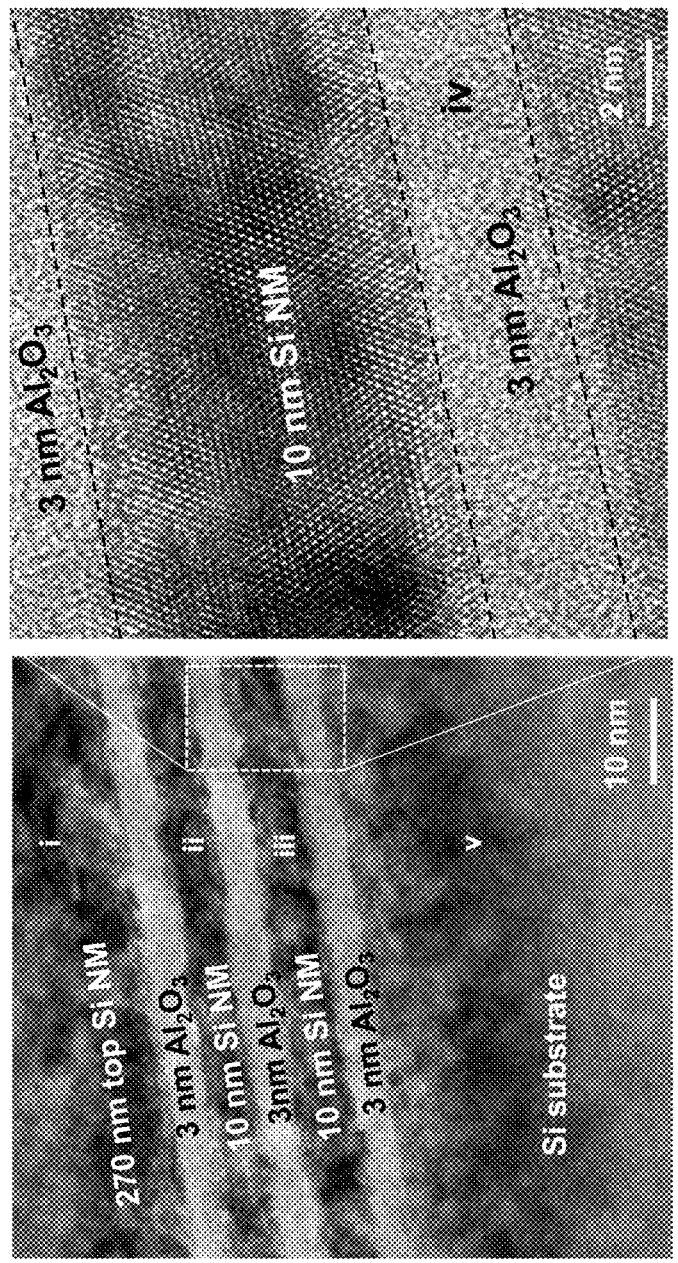
FIG. 2 shows a cross-sectional TEM image taken from a triple-barrier superlattice structure (left) and an enlarged portion thereof (right). (i): Top Si NM. (ii): $2^{nd}$ Si NM well layer. (iii): $1^{st}$ Si NM well layer. (iv): $Al_2O_3$ barrier layer. (v): Si substrate.

FIG. 2 (left and right panels) shows the cross-sectional high-resolution transmission electron microscopy (HR-TEM) images of the TB structure. The image clearly shows two distinct layers of Si NMs interdigitated by three layers of $Al_2O_3$. Electron diffraction patterns taken from the top Si NM layer and Si substrate indicated high crystalline quality for both subjects. HR-TEM images and the corresponding Fast Fourier Transform (FFM) of two ultrathin Si NMs (~10 nm thick) confirmed their single crystallinity property and great crystallographic lattice alignment with both the Si substrate and top Si NM. It was observed that the $Al_2O_3$ tunneling layer remained amorphous and became slightly thicker, possibly due to the reflow of the $Al_2O_3$ barrier layer to fill the atomic void between the $Al_2O_3$ layer and the bottom side of the transfer-printed Si NM during RTA annealing, and thus consolidated the transferred Si NMs.

Figure 3A:
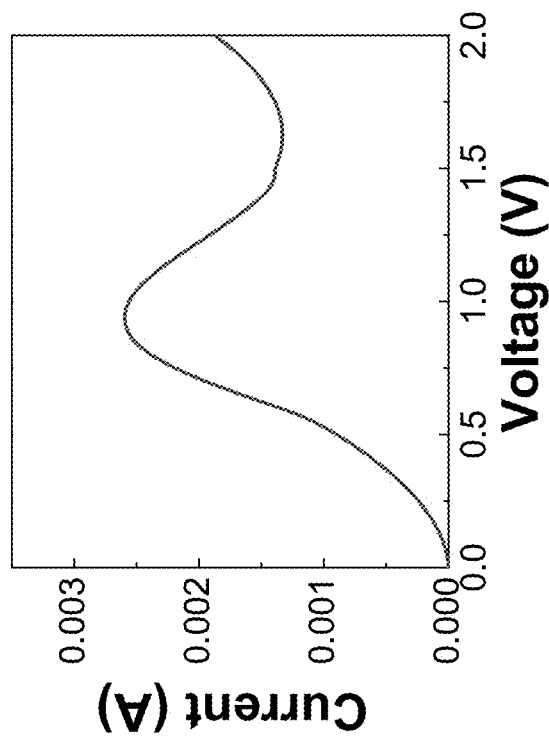
FIG. 3A depicts current-voltage (I-V) characteristics measured from a triple-barrier superlattice device at RT.
Figure 3B:
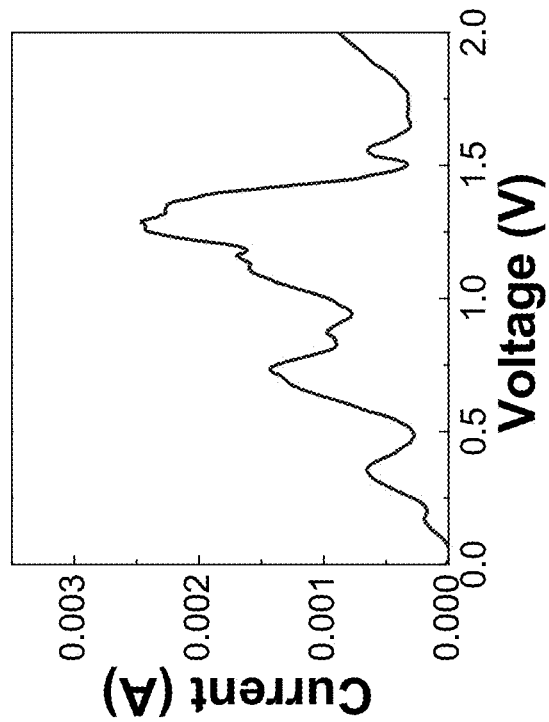
FIG. 3B depicts current-voltage (I-V) characteristics measured from the triple-barrier superlattice device at 77 K.

FIGS. 3A and 3B show the typical current-voltage (I-V) characteristics of the TB measured at RT and 77 K, respectively. I-V curves were measured using an HP4155A semiconductor parameter analyzer under dark ambient to prevent any possible photocurrent. The entire stage and samples were continuously chilled with liquid nitrogen during the low temperature measurement. Clear negative differential resistance (NDR) characteristics were observed from the device at RT. FIG. 3A shows a clear NDR observed from the TB configuration at 1.1 V with a peak-to-valley current ratio (PVCR) of 1.95. The second well of the TB structure could block electron tunneling at higher energy levels, and thus it resulted in a low valley current with a distinct NDR. The peak and valley currents of 2.59 mA and 1.33 mA, respectively, were measured from the TB superlattice structure. As the bias increased, both peak and valley currents increased, with the valley current increasing faster than the peak current, resulting in a smaller second PVCR.

FIG. 3B shows the low temperature I-V characteristic of the TB superlattice structure. Five NDR points were measured at 0.395 V, 0.77 V, 0.9 V, 1.42 V, and 1.59 V, with PVCRs with 2.38, 1.6, 1.26, 7.48, and 2.14, respectively. Multiple points of NDR observed from the TB configurations at 77 K resulted from multiple resonant energy states formed by a large conduction band offset (i.e., 2.45 eV).

Although Si and $Al_2O_3$ are specifically used in this example, the method is extendable to many other material combinations that are not suitable for epitaxy.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A quantum cascade laser comprising an active core embedded in an optical waveguide, the active core comprising a plurality of coupled stages, each stage comprising an electron injector, an active region coupled to the electron injector, and an electron extractor coupled to the active region, wherein each of the active regions comprises a semiconductor superlattice comprising alternating quantum barrier layers and quantum well layers, the quantum barrier layers comprising an amorphous inorganic material and the quantum well layers comprising a single-crystalline semiconductor, wherein the quantum cascade laser is configured to provide quantum cascade lasing.

2. The laser of claim 1, wherein the superlattice comprises at least six quantum barrier layers and at least five quantum well layers.

3. The laser of claim 1, wherein the quantum barrier layers comprise amorphous aluminum oxide and the quantum well layers are single-crystalline silicon.

4. The laser of claim 1, wherein the quantum well layers comprise a Group IV semiconductor.

5. The laser of claim 4, wherein the quantum barrier layers comprise an amorphous metal oxide.

6. The laser of claim 4, wherein the quantum barrier layers comprise an amorphous metal nitride.

7. The laser of claim 1, wherein the quantum well layers comprise a Group IV semiconductor.

8. The laser of claim 7, wherein the quantum barrier layers comprise an amorphous metal oxide.

9. The laser of claim 7, wherein the quantum barrier layers comprise an amorphous metal nitride.

10. The laser of claim 1, wherein the quantum well layers comprise a Group III-V semiconductor.

11. The laser of claim 10, wherein the quantum barrier layers comprise an amorphous metal oxide.

12. The laser of claim 10, wherein the quantum barrier layers comprise an amorphous metal nitride.

13. The laser of claim 1, wherein the quantum barrier layers comprise an amorphous metal oxide.

14. The laser of claim 1, wherein the quantum barrier layers comprise an amorphous metal nitride.

15. The laser of claim 1, wherein the quantum well layers comprise a two-dimensional semiconductor.

16. The laser of claim 15, wherein the quantum barrier layers comprise an amorphous metal oxide.

17. The laser of claim 15, wherein the quantum barrier layers comprise an amorphous metal nitride.

18. A superlattice comprising alternating quantum barrier layers and quantum well layers, the quantum barrier layers comprising an amorphous inorganic material and the quantum well layers comprising a single-crystalline Group III-V semiconductor, a single-crystalline Group II-V semiconductor, or a two-dimensional semiconductor.

19. The superlattice of claim 18, wherein the quantum barrier layers comprise an amorphous metal oxide.

20. The superlattice of claim 18, wherein the quantum barrier layers comprise an amorphous metal nitride.

21. The superlattice of claim 18, comprising at least six quantum barrier layers and at least five quantum well layers.

22. The superlattice of claim 18, wherein the quantum barrier layers comprise amorphous aluminum oxide.

* * * * *

UNITED STATES PATENT AND TRADEMARK OFFICE
CERTIFICATE OF CORRECTION

PATENT NO. : 10,615,574 B2
APPLICATION NO. : 15/982252
DATED : April 7, 2020
INVENTOR(S) : Zhenqiang Ma et al.

It is certified that error appears in the above-identified patent and that said Letters Patent is hereby corrected as shown below:

In the Specification

Column 1, Line 28:
Delete the phrase "modem electronic devices" and replace with --modern electronic devices--.

Column 1, Line 61:
Delete the phrase "Sift/single-crystalline-Si double barrier structure." and replace with --$SiO_2$/single-crystalline-Si double barrier structure.--.

Signed and Sealed this
Fourth Day of August, 2020

Andrei Iancu
*Director of the United States Patent and Trademark Office*